United States Patent
Chen et al.

(10) Patent No.: US 7,999,610 B2
(45) Date of Patent: Aug. 16, 2011

(54) CLASS D AMPLIFIER CAPABLE OF SETTING RESTRAINT POWER

(75) Inventors: Ming-Hsiung Chen, Taipei (TW);
Shang-Shu Chung, Taipei (TW);
Tung-Sheng Ku, Taipei (TW)

(73) Assignee: Amazing Microelectronic Corp. (TW)

( * ) Notice: Subject to any disclaimer, the term of this patent is extended or adjusted under 35 U.S.C. 154(b) by 177 days.

(21) Appl. No.: 12/616,378

(22) Filed: Nov. 11, 2009

(65) Prior Publication Data

US 2011/0109386 A1    May 12, 2011

(51) Int. Cl.
*H03F 3/38* (2006.01)
(52) U.S. Cl. .......................................... 330/10; 330/251
(58) Field of Classification Search .................... 330/10, 330/207 A, 251
See application file for complete search history.

(56) References Cited

U.S. PATENT DOCUMENTS

| | | | |
|---|---|---|---|
| 7,463,090 B2 * | 12/2008 | Kaiho et al. | 330/10 |
| 7,852,156 B1 * | 12/2010 | Chen et al. | 330/251 |

* cited by examiner

*Primary Examiner* — Khanh Nguyen
(74) *Attorney, Agent, or Firm* — Roger H. Chu (57) ABSTRACT

A Class D amplifier capable of setting restraint power is provided, which comprises: an audio amplification unit, a pulse width modulation (PWM) unit, a first pre-drive unit, a second pre-drive unit, a first power transistor set, a second power transistor set and a power restraint unit. The power restraint unit has a comparator circuit and a power restraint circuit. The comparator circuit is configured to compare the level of first/second amplified audio signals against the level of a first reference voltage that is externally settable. When the high level of the first/second amplified audio signals is higher than the level of the first reference voltage, the comparator circuit outputs a first comparison signal and a second comparison signal to the power restraint circuit to restrain the power.

8 Claims, 6 Drawing Sheets

CLASS D AMPLIFIER CAPABLE OF SETTING RESTRAINT POWER

BACKGROUND OF THE INVENTION

1. Technical Field

The present invention relates to a Class D amplifier, and more particularly, to a Class D amplifier capable of setting restraint power by setting a first reference voltage and restraining power of audio signals according to the level of the first reference voltage.

2. Description of Related Art

Conventional power amplifiers may be classified into Class D power amplifiers and Class AB power amplifiers, among which the Class D power amplifiers are configured to output pulse modulated signals and the Class AB power amplifiers are configured to output linear signals. Owing to the advantage of high efficiency thereof, the Class D power amplifiers have now become a byword for power amplifiers.

Figure 1:
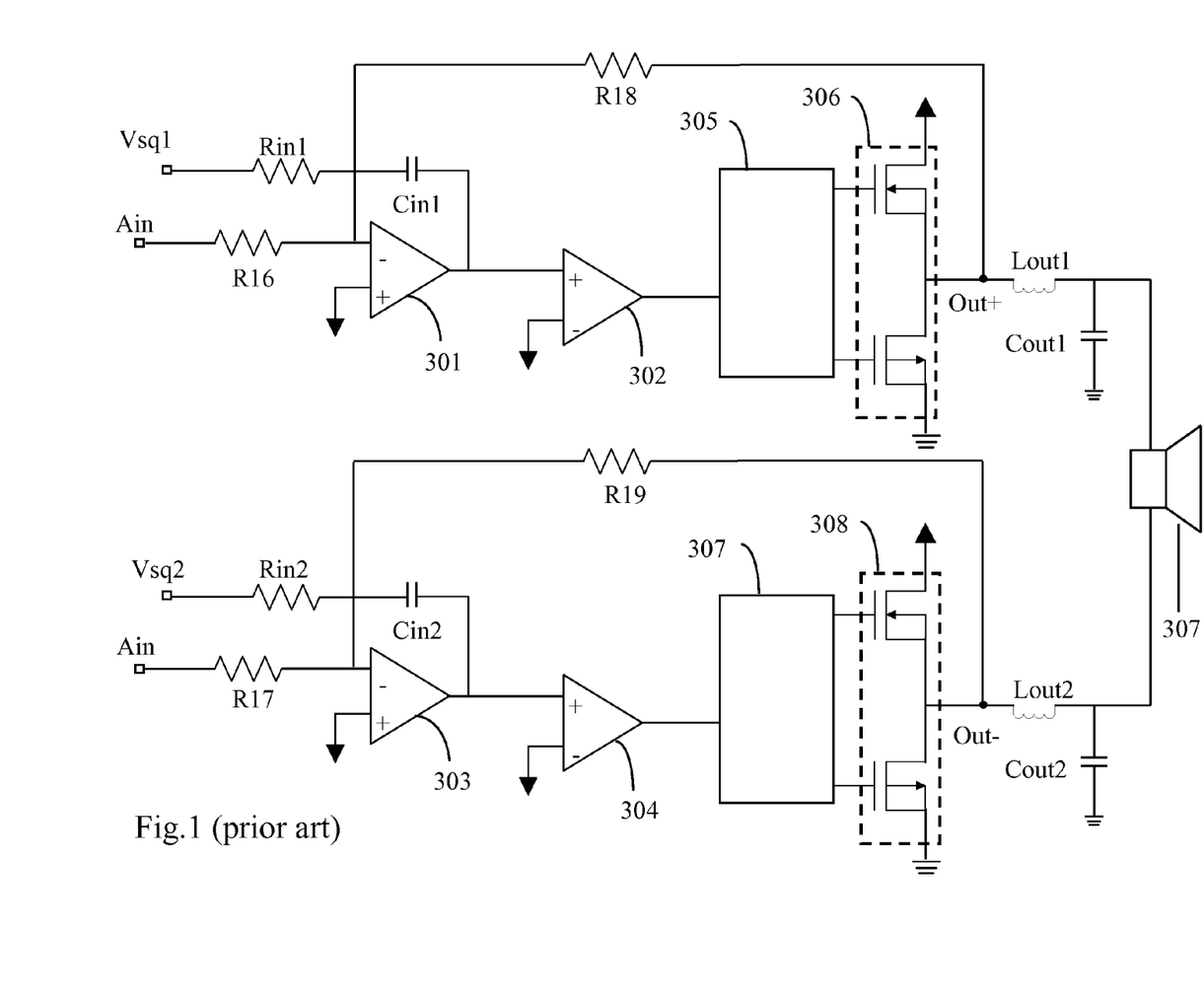
FIG. 1 is a circuit diagram of a conventional Class D audio amplifier.

Taiwan Patent No. M269646 has disclosed a square-wave modulation scheme for a Class D audio amplifier. Referring to FIG. 1, the circuit diagram of a conventional Class D audio amplifier is shown therein. The Class D audio amplifier is of a differential output configuration formed by a positive output terminal (Out+) and a negative output terminal (Out−). This Class D audio amplifier is advantageous in that by using the differential output to drive a speaker 307, power of the output audio signal can be increased so that the speaker 307 can play the audio sound more efficiently.

Operation of this Class D audio amplifier will now be briefed with reference to an upper half portion of the circuit structure of the Class D audio amplifier (i.e., a single-terminal circuit structure) as follows. From an audio input terminal Ain, an audio signal is inputted into a first operational amplifier 301 and, by means of an integrator consisting of the first operational amplifier 301, a first integrating resistor R16 and a first integrating capacitor Cin1, is transformed into a self-oscillating triangular wave signal. Furthermore, a first square wave signal Vsq1 is inputted into the first operational amplifier 301 via the first resistor Rin1 to synchronize the frequency of the triangular wave signal. Then, a pulse modulated signal is outputted through a second operational amplifier 302 to a first driver 305 which, according to the pulse modulated signal, controls an on/off status of a first transistor set 306 to output an audio signal for driving the speaker 307.

As can be known from the above description of the conventional Class D audio amplifier, the conventional Class D audio amplifier is advantageous in that, a square wave signal is used as an input to control a carrier frequency of the output signal, and design of a square wave circuit is much simpler than that of a triangular wave circuit that is conventionally used. This saves room for circuits in the integrated circuit (IC) design and consequently reduces cost of the circuit layout. However, although the differential output design in which signals are outputted by the positive output terminal (Out+) and the negative output terminal (Out−) can increase power of the output audio signal, there is a risk that the speaker 307 might be damaged due to intolerably high power of the output audio signal because a circuit unit for restraining power amplification is not provided in the circuit structure.

Accordingly, in view of the shortcomings of the conventional Class D audio amplifiers, the inventor of the present invention has made great efforts to make improvement thereon and finally provides a Class D amplifier capable of setting restrained power.

SUMMARY OF THE INVENTION

The primary objective of the present invention is to provide a Class D amplifier capable of setting restraint power by setting a first reference voltage as a level of the restraint power and restraining power of audio signals by means of a power restraint unit.

To accomplish the primary objective described above, a Class D amplifier capable of setting restraint power is provided, which comprises: an audio amplification unit, a pulse width modulation (PWM) unit, a first pre-drive unit, a second pre-drive unit, a first power transistor set, a second power transistor set and a power restraint unit. The audio amplification unit is configured to receive and amplify first input audio signals and second input audio signals. The PWM unit is configured to perform pulse width modulation on first amplified audio signals and second amplified audio signals. The first pre-drive unit is configured to control the on/off status of the first power transistor set according to first PWM signals. The second pre-drive unit is configured to control the on/off status of the second power transistor set according to second PWM signals. The first power transistor set is configured to output first output audio signals for driving an external speaker unit. The second power transistor set is configured to output second output audio signals for driving the external speaker unit. The power restraint unit has a comparator circuit and a power restraint circuit. The comparator circuit is configured to compare the first/second amplified audio signals against the level of a first reference voltage. If the high level first/second amplified audio signals is higher than the first reference voltage, it means that the output power of the first/second output audio signals is too high, in which case the comparator circuit outputs a first comparison signal and a second comparison signal to the power restraint circuit. Then, the power restraint circuit decreases a DC level of the first/second input audio signals, so that DC level of the first/second output audio signals is decreased, thereby accomplishing the goal of restraining the power of the output audio signals to prevent damage of the speaker unit.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To explain the Class D amplifier capable of setting restraint power of the present invention more clearly, preferred embodiments thereof will be described in detail hereinbelow with reference to the attached drawings.

Figure 2:
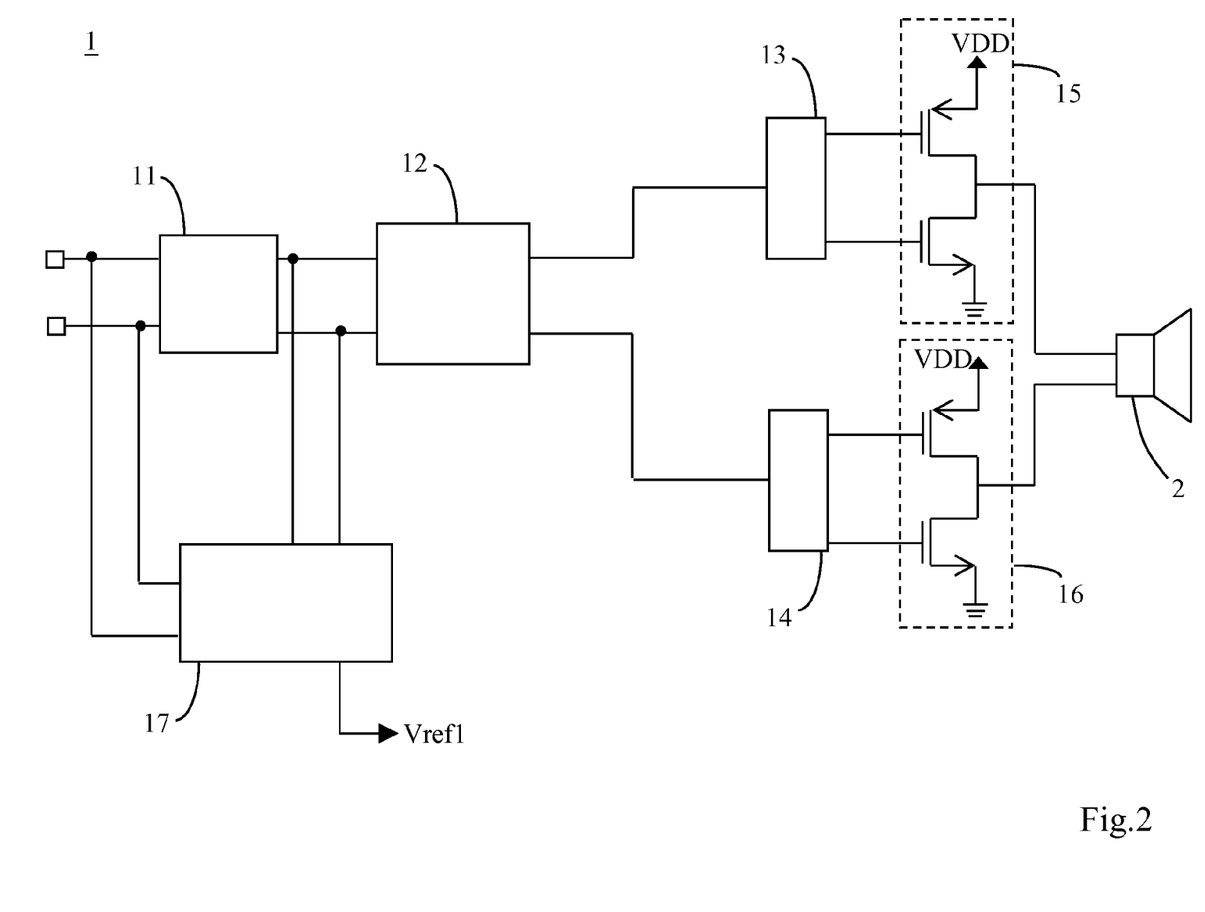
FIG. 2 is a Class D amplifier capable of setting restraint power according to the present invention.

Referring to FIG. 2, there is shown a Class D amplifier capable of setting restraint power according to the present invention. The Class D amplifier 1 capable of setting restraint power comprises an audio amplification unit 11, a PWM unit 12, a first pre-drive unit 13, a second pre-drive unit 14, a first power transistor set 15, a second power transistor set 16 and a power restraint unit 17.

The audio amplification unit 11 is configured to receive and amplify first input audio signals and second input audio signals to output first amplified audio signals and second amplified audio signals.

The PWM unit 12 is coupled to the audio amplification unit 11 and configured to receive and perform pulse width modulation on the first amplified audio signals and the second amplified audio signals to output first pulse width modulated signals and second pulse width modulated signals.

The first pre-drive unit 13 is coupled to the PWM unit 12 to receive the first pulse width modulated signals and configured to control circuit units of the next stage according to the first pulse width modulated signals.

The second pre-drive unit 14 is coupled to the PWM unit 12 to receive the second pulse width modulated signals and configured to control circuit units of the next stage according to the second pulse width modulated signals.

The first power transistor set 15 is coupled to the first pre-drive unit 13. Upon receiving the first pulse width modulated signals, the first pre-drive unit 13 controls the on/off status of the first power transistor set 15 according to the first pulse width modulated signals so that the first power transistor set 15 outputs first output audio signals for driving an external speaker unit 2.

The second power transistor set 16 is coupled to the second pre-drive unit 14. Upon receiving the second pulse width modulated signals, the second pre-drive unit 14 controls the on/off status of the second power transistor set 16 according to the second pulse width modulated signals so that the second power transistor set 16 outputs second output audio signals for driving the external speaker unit 2.

Figure 5:
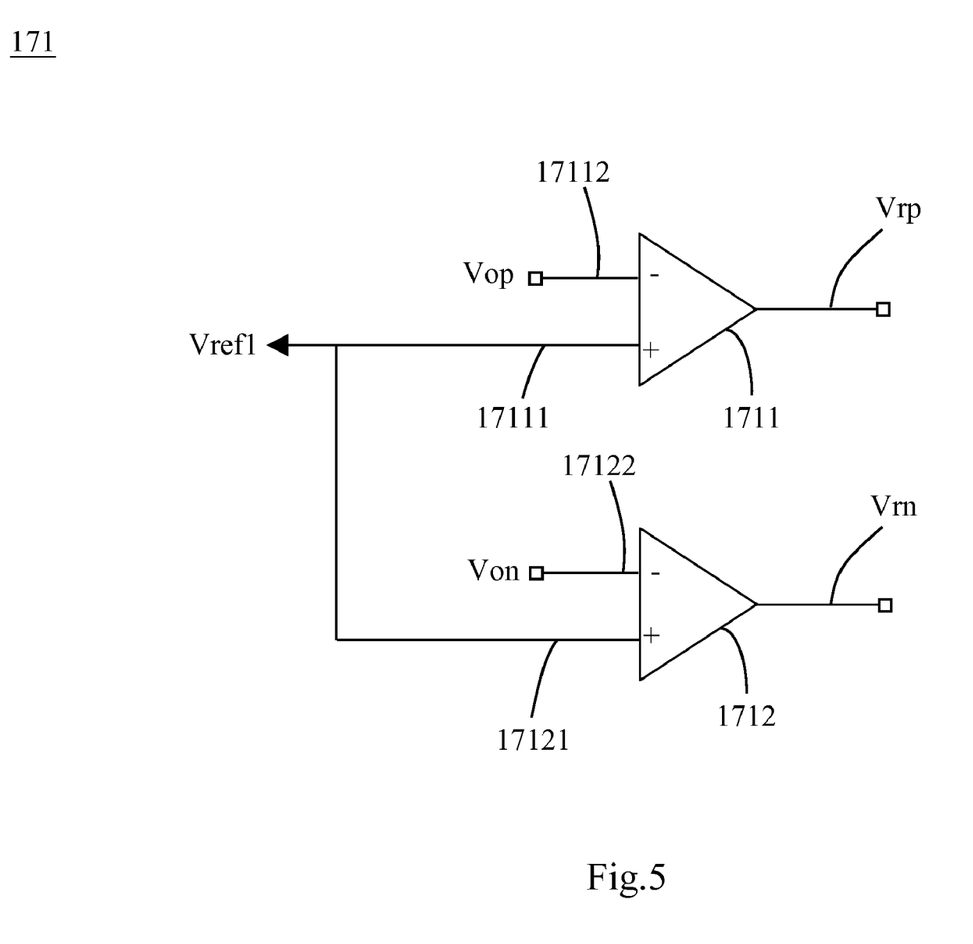
FIG. 5 is a circuit diagram of a comparator circuit of the Class D amplifier capable of setting restrained power.
Figure 6:
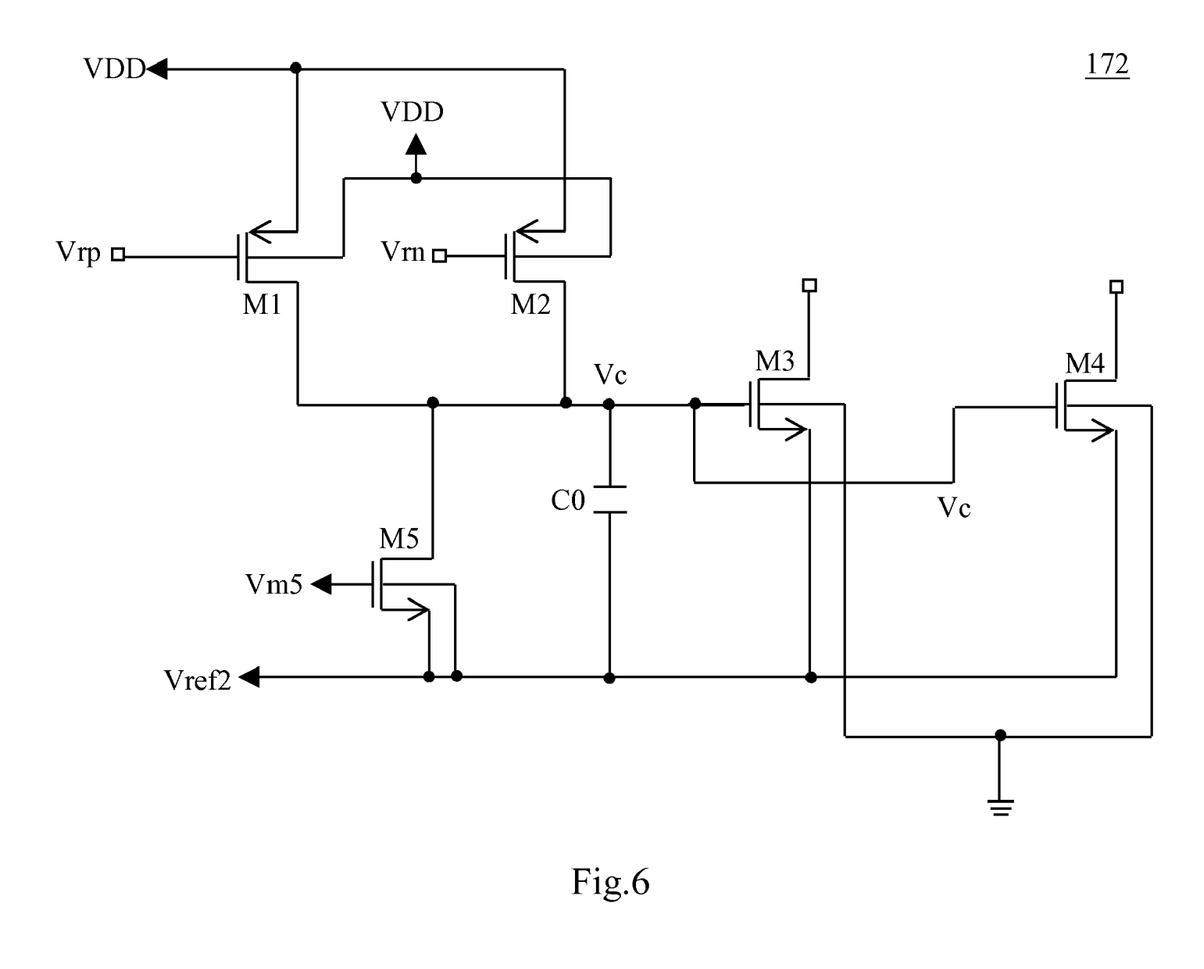
FIG. 6 is a circuit diagram of a power restraint circuit of the Class D amplifier capable of setting restrained power.

The power restraint unit 17 is coupled to the audio amplification unit 11 and an external first reference voltage Vref1. The first reference voltage Vref1 is used as a reference level for restraining the first/second amplified audio signals. The level of the first reference voltage Vref1 is capable of being altered according to an external setting so as to change a restrained level of the first/second amplified audio signals. Referring to FIGS. 5 and 6 together, the circuit diagram of a comparator circuit is shown therein. The power restraint unit 17 has a comparator circuit 171 and a power restraint circuit 172. The comparator circuit 171 is configured to compare the first/second amplified audio signals against the first reference voltage Vref1. If the high level of the first/second amplified audio signals is higher than the level of the first reference voltage Vref1, it means that power of the first/second output audio signals for driving the speaker unit 2 is too high, in which case the comparator circuit 171 outputs a first comparison signal and a second comparison signal to the power restraint circuit 172. Then, the power restraint circuit 172 decreases the power of the first/second output audio signals by decreasing the DC level of the first/second input audio signals to prevent the power of the output audio signals from going too high and causing damage to the speaker unit 2.

Figure 3:
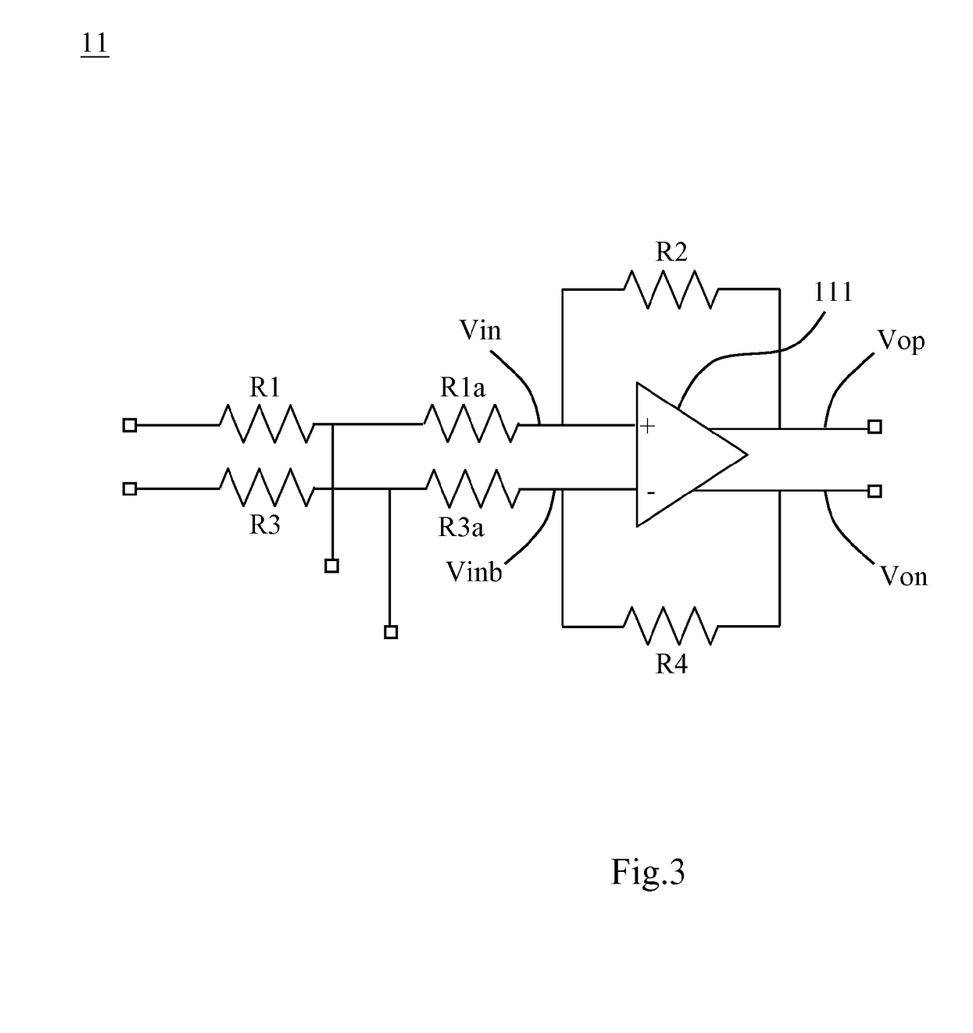
FIG. 3 is a circuit diagram of an audio amplification unit of the Class D amplifier capable of setting restrained power.

For the primary circuit structure of the Class D amplifier 1 capable of setting restraint power, referring to FIG. 3 together, the circuit diagram of the audio amplification unit is shown therein. The audio amplification unit 11 further comprises an audio amplifier 111, a first pre-input resistor R1, a first input resistor R1a, a second pre-input resistor R3, a second input resistor R3a, a first amplifying resistor R2 and a second amplifying resistor R4. The audio amplifier 111 has a first amplifier input terminal Vin, a second amplifier input terminal Vinb, a first amplifier output terminal Vop and a second amplifier output terminal Von. The audio amplifier 111 is configured to receive, via the first amplifier input terminal Vin and the second amplifier input terminal Vinb respectively, and amplify the first input audio signals and the second input audio signals to output the first amplified audio signals and the second amplified audio signals to the PWM unit 12 of the next stage via the first amplifier output terminal Vop and the second amplifier output terminal Von respectively. The first pre-input resistor R1 is coupled to the first input audio signals for use as one of input resistors of the audio amplifier 111, the first input resistor R1a is coupled to the first pre-input resistor R1 and the first amplifier input terminal Vin for use as the input resistor of the audio amplifier 111. The second pre-input resistor R3 is coupled to the second amplifier input terminal Vinb for use as the input resistor of the audio amplifier 111. The second input resistor R3a is coupled to the second pre-input resistor R3 and the second amplifier input terminal Vinb for use as the input resistor of the audio amplifier 111. In this embodiment, the first input resistor R1a has a resistance less than that of the first pre-input resistor R1, and the second input resistor R3a has a resistance less than that of the second pre-input resistor R3. Besides, the first amplifying resistor R2 is coupled between the first amplifier input terminal Vin and the first amplifier output terminal Vop, and by adjusting resistance of the first amplifying resistor R2, the gain of the first amplified audio signals outputted by the audio amplifier 111 can be increased/decreased. Further, the second amplifying resistor R4 is coupled between the second amplifier input terminal Vinb and the second amplifier output terminal Von, and by adjusting resistance of the second amplifying resistor R4, the gain of the second amplified audio signals outputted by the audio amplifier 111 is able to be increased/decreased.

Figure 4:
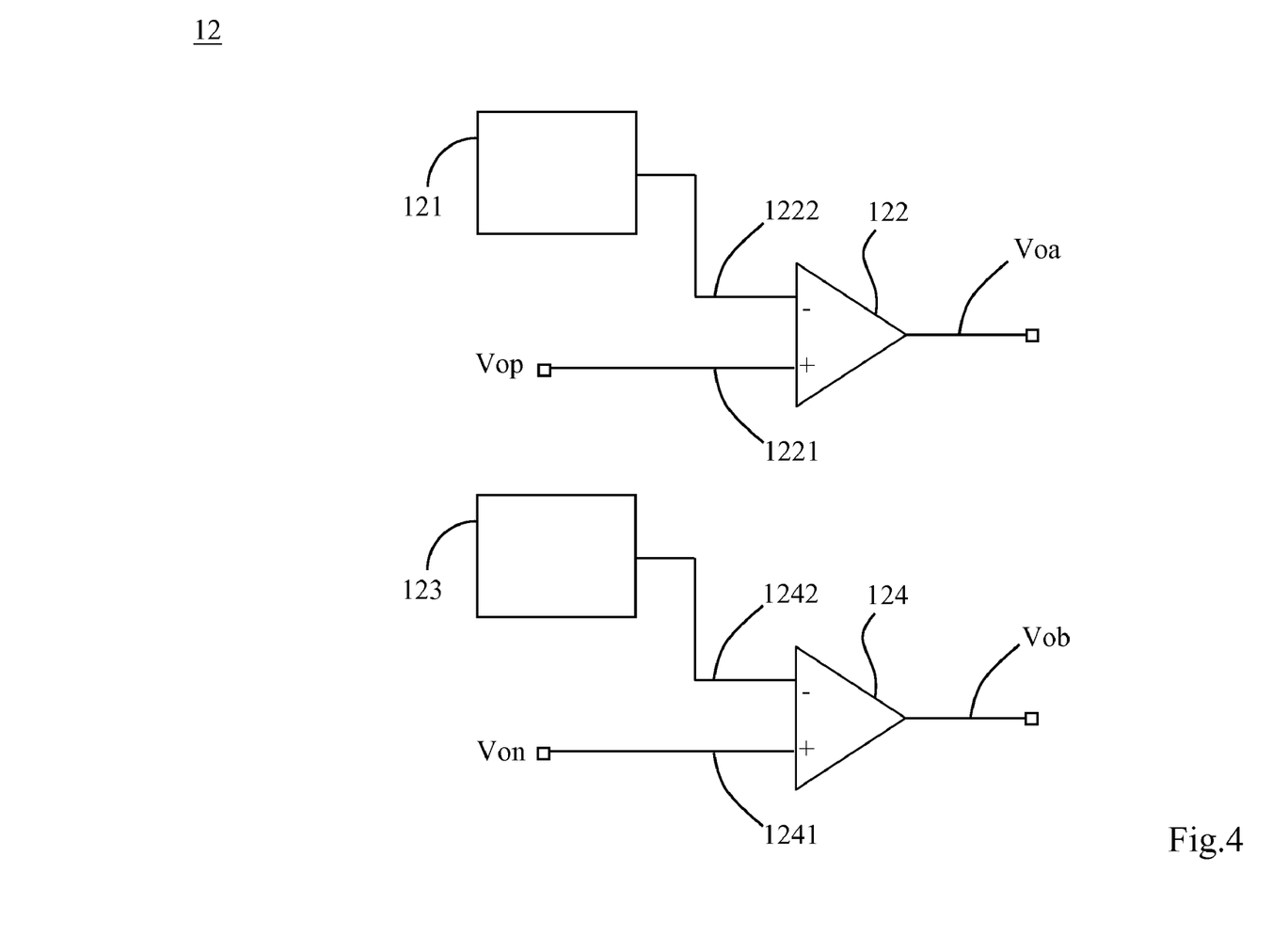
FIG. 4 is a circuit diagram of a PWM unit of the Class D amplifier capable of setting restrained power.

Referring to FIG. 4, the circuit diagram of the PWM unit is shown therein. In this embodiment, the PWM unit 12 further comprises a first oscillation wave generator 121, a first comparator 122, a second oscillation wave generator 123 and a second comparator 124. The first oscillation wave generator 121 is configured to generate first oscillation wave signals. The first comparator 122 has a first comparator positive input terminal 1221, a first comparator negative input terminal 1222 and a first comparator output terminal Voa. The first comparator positive input terminal 1221 is coupled to the first amplifier output terminal Vop to receive the first amplified audio signals, and the first comparator negative input terminal 1222 is coupled to the first oscillation wave generator 121 to receive the first oscillation wave signals. The first comparator 122 compares the first amplified audio signals against the first oscillation wave signals and then outputs the first pulse width modulated signals from the first comparator output terminal Voa. Also, the second oscillation wave generator 123 is configured to generate second oscillation wave signals. The second comparator 124 has a second comparator positive input terminal 1241, a second comparator negative input terminal 1242 and a second comparator output terminal Vob. The second comparator positive input terminal 1241 is coupled to the second amplifier output terminal Von to receive the second amplified audio signals, and the second comparator negative input terminal 1242 is coupled to the second oscillation wave generator 123 to receive the second oscillation wave signals. The second comparator 124 compares the second amplified audio signals against the second oscillation wave signals and then outputs the second pulse width modulated signals from the second comparator output terminal Vob.

Refer to FIGS. 2, 5 and 6 together for the power restraint unit 17. The comparator circuit 171 of the power restraint unit 17 further comprises a third comparator 1711 and a fourth comparator 1712. The third comparator 1711 has a third comparator positive input terminal 17111, a third comparator negative input terminal 17112 and a third comparator output terminal Vrp. The third comparator positive input terminal 17111 is coupled to the first reference voltage Vref1, and the third comparator negative input terminal 17112 is coupled to the first amplifier output terminal Vop to receive the first amplified audio signals. The third comparator 1711 is configured to compare the first reference voltage Vref1 against the first amplified audio signals, and if the high level of the first amplified audio signals is higher than the level of the first reference voltage Vref1, the third comparator 1711 outputs the first comparison signal to the power restraint circuit 172 so that a level adjustment is made by the power restraint circuit 172. The fourth comparator 1712 has a fourth comparator positive input terminal 17121, a fourth comparator negative input terminal 17122 and a fourth comparator output terminal Vrn. The fourth comparator positive input terminal 17121 is coupled to the first reference voltage Vref1, and the fourth comparator negative input terminal 17122 is coupled to the second amplifier output terminal Von to receive the second amplified audio signals. The fourth comparator 1712 is configured to compare the first reference voltage Vref1 against the second amplified audio signals, and if the high level of the second amplified audio signals is higher than the level of the first reference voltage Vref1, the fourth comparator 1712 outputs the second comparison signal to the power restraint circuit 172 so that the level adjustment is made by the power restraint circuit 172.

Referring to FIG. 6 again, the circuit diagram of the power restraint circuit is shown therein. The power restraint circuit 172 further comprises a first field effect transistor (FET) M1, a second FET M2, a charging capacitor C0, a third FET M3, a fourth FET M4, and a fifth FET M5. Referring also to FIG. 5, the first FET M1 has a gate thereof coupled to the third comparator output terminal Vrp, and has a source and a base thereof coupled to an externally applied bias VDD. When the first comparison signal is outputted by the third comparator 1711 to the gate of the first FET M1, the first FET M1 will be turned on. The second FET M2 has a gate thereof coupled to the fourth comparator output terminal Vrn, and has a source and a base thereof coupled to the externally applied bias VDD. When the second comparison signal is outputted by the fourth comparator 1712 to the gate of the second FET M2, the second FET M2 will be turned on. The charging capacitor C0 is coupled to the drain of the first FET M1 and the drain of the second FET M2, so when the first FET M1 or the second FET M2 is turned on, the charging capacitor C0 will be charged to produce a capacitor voltage Vc.

Continuing to refer to FIG. 6, the third FET M3 has a gate thereof coupled to the drain of the first FET M1, the drain of the second FET M2 and the charging capacitor C0. Besides, referring to FIG. 3 together, the third FET M3 has a drain thereof coupled between the first pre-input resistor R1 and the first input resistor R1a, and has a source thereof coupled to a second reference voltage Vref2. Unlike the first reference voltage Vref1 which is settable and alterable, the second reference voltage Vref2 is a fixed value in this embodiment. Besides, the third FET M3 has a base thereof grounded, so after the first FET M1 and the second FET M2 is turned on to charge the charging capacitor C0 to produce the capacitor voltage Vc, the capacitor voltage Vc turns on the third FET M3. At this point, the DC level of the first input audio signals will be pulled by the turned-on third FET M3 to the same level as that of the second reference voltage Vref2. Moreover, as the DC level of the first input audio signals has be pulled down to the level of the second reference voltage Vref2, the DC level of the first output audio signals that is outputted via the first power transistor set 15 to the speaker unit 2 will also be pulled down to the level of the second reference voltage Vref2, thereby accomplishing the goal of restraining power of the first output audio signals.

Continuing to refer to FIGS. 3 and 6, similarly, the fourth FET M4 has a gate thereof coupled to the drain of the first FET M1, the drain of the second FET M2 and the charging capacitor C0, has a drain thereof coupled between the second pre-input resistor R3 and the second input resistor R3a, and has a source thereof coupled to the second reference voltage Vref2. When the charging capacitor C0 is charged to produce the capacitor voltage Vc, the fourth FET M4 will be turned on by the capacitor voltage Vc. At this point, the DC level of the second input audio signals will be pulled by the turned-on third FET M3 to the same level as that of the second reference voltage Vref2, thereby accomplishing the goal of restraining power of the second output audio signals. Moreover, the fifth FET M5 has a gate thereof coupled to a turn-on voltage Vm5 so as to keep the fifth FET M5 at the on status. Further, the fifth FET M5 is connected in parallel with the charging capacitor C0. Hence, when the first FET M1 is turned off because the third comparator 1711 does not output the first comparison signal to the gate of the first FET M1 and the second FET M2 is turned off because the fourth comparator 1712 does not output the second comparison signal to the gate of the second FET M2, the charging capacitor C0 will be discharged through the fifth FET M5 to avoid a too fast discharging speed and consequent damage to the circuit which would occur if it were discharged directly.

In summary, from the above disclosures of embodiments of the present invention, it can be known that the present invention offers the following advantages:

1. The present invention uses an externally settable level of the first reference voltage as the restrained level of the first/the second amplified audio signals, so the restrained level of the high-level voltage of the first/the second amplified audio signals can be altered by adjusting the level of the first reference voltage; and
2. By means of a comparator circuit, the present invention can determine whether the first/the second amplified audio signals are higher than the restrained level. If yes, the power restraint unit will operate to decrease the DC level of the first/the second input audio signals to the same level as that of the second reference voltage, thereby accomplishing the purpose of restraining power of the first/the second output audio signals.

What is claimed is:

1. A Class D amplifier capable of setting restraint power, the Class D amplifier comprising:
    an audio amplification unit, being configured to receive and amplify first input audio signals and second input audio signals to output first amplified audio signals and second amplified audio signals;
    a pulse width modulation (PWM) unit, being coupled to the audio amplification unit and configured to receive and perform pulse width modulation on the first amplified audio signals and the second amplified audio signals to output first pulse width modulated signals and second pulse width modulated signals;
    a first pre-drive unit, being coupled to the PWM unit and configured to receive the first pulse width modulated signals and control circuit units of the next stage coupled thereto according to the first pulse width modulated signals;
    a second pre-drive unit, being coupled to the PWM unit and configured to receive the second pulse width modulated signals and control circuit units of the next stage coupled thereto according to the second pulse width modulated signals;

a first power transistor set, being coupled to the first pre-drive unit, wherein upon receiving the first pulse width modulated signals, the first pre-drive unit controls the on/off status of the first power transistor set according to the first pulse width modulated signals so that the first power transistor set outputs first output audio signals for driving an external speaker unit;

a second power transistor set, being coupled to the second pre-drive unit, wherein upon receiving the second pulse width modulated signals, the second pre-drive unit controls the on/off status of the second power transistor set according to the second pulse width modulated signals so that the second power transistor set outputs second output audio signals for driving the external speaker unit; and a power restraint unit, being coupled to the audio amplification unit and an external first reference voltage and having a comparator circuit and a power restraint circuit, wherein the comparator circuit is configured to compare the high level of the first/second amplified audio signals against the level of the first reference voltage, and when the high level of the first/second amplified audio signals is higher than the level of the first reference voltage, meaning that power of the first/second output audio signals for driving the speaker unit is too high, the comparator circuit outputs a first comparison signal and a second comparison signal to the power restraint circuit, and then the power restraint circuit restrains the power of the first/second output audio signals by decreasing a DC level of the first/second input audio signals to prevent the output audio power of the first/second output audio signals from going too high and causing damage to the speaker unit.

2. The Class D amplifier capable of setting restraint power of claim 1, wherein the audio amplification unit further comprises:

an audio amplifier, having a first amplifier input terminal, a second amplifier input terminal, a first amplifier output terminal and a second amplifier output terminal, wherein the audio amplifier is configured to receive, via the first amplifier input terminal and the second amplifier input terminal respectively, and amplify the first input audio signals and the second input audio signals to output the first amplified audio signals and the second amplified audio signals to the PWM unit via the first amplifier output terminal and the second amplifier output terminal;

a first pre-input resistor, being coupled to the first input audio signals for use as one of input resistors of the audio amplifier;

a second pre-input resistor, being coupled to the second input audio signals for use as the input resistor of the audio amplifier;

a first input resistor, being coupled to the first pre-input resistor and the first amplifier input terminal for acting as the input resistor of the audio amplifier;

a second input resistor, being coupled to the second pre-input resistor and the second amplifier input terminal for acting as the input resistor of the audio amplifier;

a first amplifying resistor, being coupled between the first amplifier input terminal and the first amplifier output terminal, wherein by adjusting resistance of the first amplifying resistor, a gain of the first amplified audio signals outputted by the audio amplifier can be increased/decreased; and a second amplifying resistor, being coupled between the second amplifier input terminal and the second amplifier output terminal, wherein by adjusting resistance of the second amplifying resistor, a gain of the second amplified audio signals outputted by the audio amplifier is able to be increased/decreased.

3. The Class D amplifier capable of setting restraint power of claim 2, wherein the PWM unit further comprises:

a first oscillation wave generator, being configured to generate first oscillation wave signals;

a first comparator, having a first comparator positive input terminal, a first comparator negative input terminal and a first comparator output terminal, wherein the first comparator positive input terminal is coupled to the first amplifier output terminal to receive the first amplified audio signals, and the first comparator negative input terminal is coupled to the first oscillation wave generator to receive the first oscillation wave signals, and wherein the first comparator is configured to compare the first amplified audio signals against the first oscillation wave signals and then output the first pulse width modulated signals to the first pre-drive unit via the first comparator output terminal;

a second oscillation wave generator, being configured to generate second oscillation wave signals; and a second comparator, having a second comparator positive input terminal, a second comparator negative input terminal and a second comparator output terminal, wherein the second comparator positive input terminal is coupled to the second amplifier output terminal to receive the second amplified audio signals, and the second comparator negative input terminal is coupled to the second oscillation wave generator to receive the second oscillation wave signals, and wherein the second comparator is configured to compare the second amplified audio signals against the second oscillation wave signals and then output the second pulse width modulated signals to the second pre-drive unit via the second comparator output terminal.

4. The Class D amplifier capable of setting restraint power of claim 3, wherein the comparator circuit further comprises:

a third comparator, having a third comparator positive input terminal, a third comparator negative input terminal and a third comparator output terminal, wherein the third comparator positive input terminal is coupled to the first reference voltage, and the third comparator negative input terminal is coupled to the first amplifier output terminal, and wherein the third comparator is configured to compare the level of the first reference voltage against the high level of the first amplified audio signals, and when the high level of the first amplified audio signals is higher than the level of the first reference voltage, the third comparator outputs the first comparison signal to the power restraint circuit; and a fourth comparator, having a fourth comparator positive input terminal, a fourth comparator negative input terminal and a fourth comparator output terminal, wherein the fourth comparator positive input terminal is coupled to the first reference voltage, and the fourth comparator negative input terminal is coupled to the second amplifier output terminal, and wherein the fourth comparator is configured to compare the level of the first reference voltage against the high level of the second amplified audio signals, and when the high level of the second amplified audio signals is higher than the level of the first reference voltage, the fourth comparator outputs the second comparison signal to the power restraint circuit.

5. The Class D amplifier capable of setting restrained power of claim 4, wherein the power restraint circuit further comprises:
   a first field effect transistor (FET), having a gate thereof coupled to the third comparator output terminal, and having a source and a base thereof coupled to an externally applied bias, wherein when the first comparison signal is outputted by the third comparator to the gate of the first FET, the first FET is turned on;
   a second FET, having a gate thereof coupled to the fourth comparator output terminal, and having a source and a base thereof coupled to the externally applied bias, wherein when the second comparison signal is outputted by the fourth comparator to the gate of the second FET, the second FET is turned on;
   a charging capacitor, being coupled to the drain of the first FET and the drain of the second FET, wherein when the first FET or the second FET is turned on, the charging capacitor is charged to produce a capacitor voltage;
   a third FET, having a gate thereof coupled to the drain of the first FET, the drain of the second FET and the charging capacitor, having a drain thereof coupled between the first pre-input resistor and the first input resistor, having a source thereof coupled to a second reference voltage, and having a base thereof grounded, wherein after the charging capacitor is charged to produce the capacitor voltage, the third FET is turned on by the capacitor voltage, and the DC level of the first input audio signals is pulled by the turned-on third FET to the same level as that of the second reference voltage, and consequently, the DC level of the first output audio signals is also pulled to the same level as that of the second reference voltage, thereby restraining power of the first output audio signals;
   a fourth FET, having a gate thereof coupled to the drain of the first FET, the drain of the second FET and the charging capacitor, having a drain thereof coupled between the second pre-input resistor and the second input resistor, and having a source thereof coupled to the second reference voltage, wherein after the charging capacitor is charged to produce the capacitor voltage, the fourth FET is turned on by the capacitor voltage, and the DC level of the second input audio signals is pulled by the turned-on fourth FET to the same level as that of the second reference voltage, and consequently, the DC level of the second output audio signals is also pulled to the same level as that of the second reference voltage, thereby restraining power of the second output audio signals;
   a fifth FET, having a gate thereof coupled to a turn-on voltage so as to keep the fifth FET at on status, having a drain thereof coupled to the drain of the first FET, the drain of the second FET and the charging capacitor simultaneously, and having a source thereof coupled to the second reference voltage, wherein when the first FET is turned off because the third comparator does not output the first comparison signal to the gate of the first FET and the second FET is turned off because the fourth comparator does not output the second comparison signal to the gate of the second FET, the charging capacitor is discharged through the fifth FET to avoid a too fast discharging speed of the charging capacitor and consequent damage to the circuit.

6. The Class D amplifier capable of setting restrained power of claim 1, wherein the level of the first reference voltage can be altered by an external setting.

7. The Class D amplifier capable of setting restrained power of claim 5, wherein unlike the first reference voltage, the second reference voltage is of a fixed value.

8. The Class D amplifier capable of setting restrained power of claim 2, wherein resistance of the first input resistor is less than resistance of the first pre-input resistor, and resistance of the second input resistor is less than resistance of the second pre-input resistor.

* * * * *